(12) United States Patent
Hsu et al.

(10) Patent No.: US 11,146,060 B2
(45) Date of Patent: Oct. 12, 2021

(54) ELECTROSTATIC DISCHARGE PROTECTION DEVICE AND ELECTROSTATIC DISCHARGE DETECTOR CIRCUIT

(71) Applicant: Realtek Semiconductor Corporation, Hsinchu (TW)

(72) Inventors: Hsin-Cheng Hsu, Hsinchu County (TW); Tay-Her Tsaur, Zhubei (TW); Po-Ching Lin, Zhubei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 265 days.

(21) Appl. No.: 16/157,534

(22) Filed: Oct. 11, 2018

(65) Prior Publication Data

US 2019/0341772 A1 Nov. 7, 2019

(30) Foreign Application Priority Data

May 1, 2018 (TW) ................................ 107114794

(51) Int. Cl.
*H02H 9/04* (2006.01)
*G01R 31/00* (2006.01)
*H02H 1/00* (2006.01)

(52) U.S. Cl.
CPC ........... *H02H 9/041* (2013.01); *G01R 31/002* (2013.01); *H02H 1/0007* (2013.01); *H02H 9/046* (2013.01)

(58) Field of Classification Search
CPC ............ H02H 9/00; H02H 9/04; H02H 9/041; H02H 9/045; H02H 9/046; H02H 1/007;
(Continued)

(56) References Cited

U.S. PATENT DOCUMENTS

| | | | |
|---|---|---|---|
| 7,098,511 B2 | 8/2006 | Ker et al. | |
| 7,221,551 B2 | 5/2007 | Chen | |

(Continued)

FOREIGN PATENT DOCUMENTS

| | | |
|---|---|---|
| CN | 104979814 A | 10/2015 |
| TW | 201340522 A | 10/2013 |
| TW | I627727 B | 6/2018 |

OTHER PUBLICATIONS

U.S. Appl. No. 15/702,745, filed Sep. 12, 2017.

*Primary Examiner* — Gustavo A Rosario-Benitez
(74) *Attorney, Agent, or Firm* — Locke Lord LLP; Tim Tingkang Xia, Esq.

(57) ABSTRACT

An electrostatic discharge (ESD) protection device includes a voltage divider circuit, a detection circuit, and a clamping circuit. The voltage divider circuit outputs N−1 bias voltages according to a first voltage and a second voltage, in which N is a positive integer greater than or equal to 2. The detection circuit detects an ESD event according to a voltage level at a predetermined node associated with the first voltage and the second voltage, and to generate N control signals according to the first voltage, the second voltage, and the N−1 bias voltages. When the ESD event occurs, the voltage level of the N control signals are the same as the first voltage. The clamping circuit is turned on according to the N control signals when the ESD event occurs, in order to provide a discharging path of a current associated with the ESD event.

14 Claims, 4 Drawing Sheets

(58) Field of Classification Search
CPC ............. H01L 27/0266; H01L 27/0285; H01L
1/0007; H01L 21/78; H01L 27/0255;
H01L 21/302; H01L 21/48; H01L
2924/0014; H01L 2924/00; G01R 31/002
See application file for complete search history.

(56) References Cited

U.S. PATENT DOCUMENTS

| | | | |
|---|---|---|---|
| 7,397,280 B2 | 7/2008 | Ker et al. | |
| 7,782,580 B2* | 8/2010 | Gauthier, Jr. | H01L 27/0285 361/56 |
| 8,059,376 B2 | 11/2011 | Chen et al. | |
| 9,373,612 B1* | 6/2016 | Huang | H01L 27/0288 |
| 2005/0134295 A1 | 6/2005 | Blumenthal | |
| 2005/0180073 A1 | 8/2005 | Armer et al. | |
| 2005/0275989 A1* | 12/2005 | Chen | H01L 27/0266 361/93.1 |
| 2006/0092590 A1 | 5/2006 | Chuang et al. | |
| 2007/0103825 A1 | 5/2007 | Ker et al. | |
| 2007/0283052 A1* | 12/2007 | Wojewoda | H03K 19/17764 710/2 |
| 2007/0285854 A1* | 12/2007 | Rodgers | H02H 3/006 361/56 |
| 2009/0161273 A1* | 6/2009 | Li | H02H 9/046 361/56 |
| 2010/0194428 A1* | 8/2010 | Koo | H03K 19/018521 326/30 |
| 2012/0081820 A1 | 4/2012 | Chu et al. | |
| 2012/0182654 A1* | 7/2012 | Wang | H02H 9/046 361/56 |
| 2012/0236447 A1* | 9/2012 | Mack | H02H 9/046 361/56 |
| 2013/0141825 A1 | 6/2013 | Kitagawa et al. | |
| 2013/0182359 A1 | 7/2013 | Jeon et al. | |
| 2013/0229736 A1* | 9/2013 | Van Der Borght | H02H 9/046 361/56 |
| 2014/0063665 A1* | 3/2014 | Chen | H02H 9/041 361/56 |
| 2018/0316185 A1* | 11/2018 | Lai | H01L 27/11206 |

* cited by examiner

ELECTROSTATIC DISCHARGE PROTECTION DEVICE AND ELECTROSTATIC DISCHARGE DETECTOR CIRCUIT

RELATED APPLICATIONS

This application claims priority to Taiwan Application Serial Number 107114794, filed May 1, 2018, which is herein incorporated by reference.

BACKGROUND

Technical Field

The present disclosure relates to an electrostatic discharge protection device. More particularly, the present disclosure relates to an electrostatic discharge protection device and a detector circuit thereof that maintain a voltage difference of two terminals of a component.

Description of Related Art

Generally, an integrated circuit is implemented with one or more transistors. With the development of the manufacturing process, the size of the transistors is significantly reduced. As a result, a voltage that can be withstood by any two terminals of the transistor becomes lower. In order to prevent the integrated circuit from being damaged by an over voltage stress, which is introduced from an electrostatic discharge event, an electrostatic discharge protection circuit is normally utilized.

DETAILED DESCRIPTION

Figure 1:
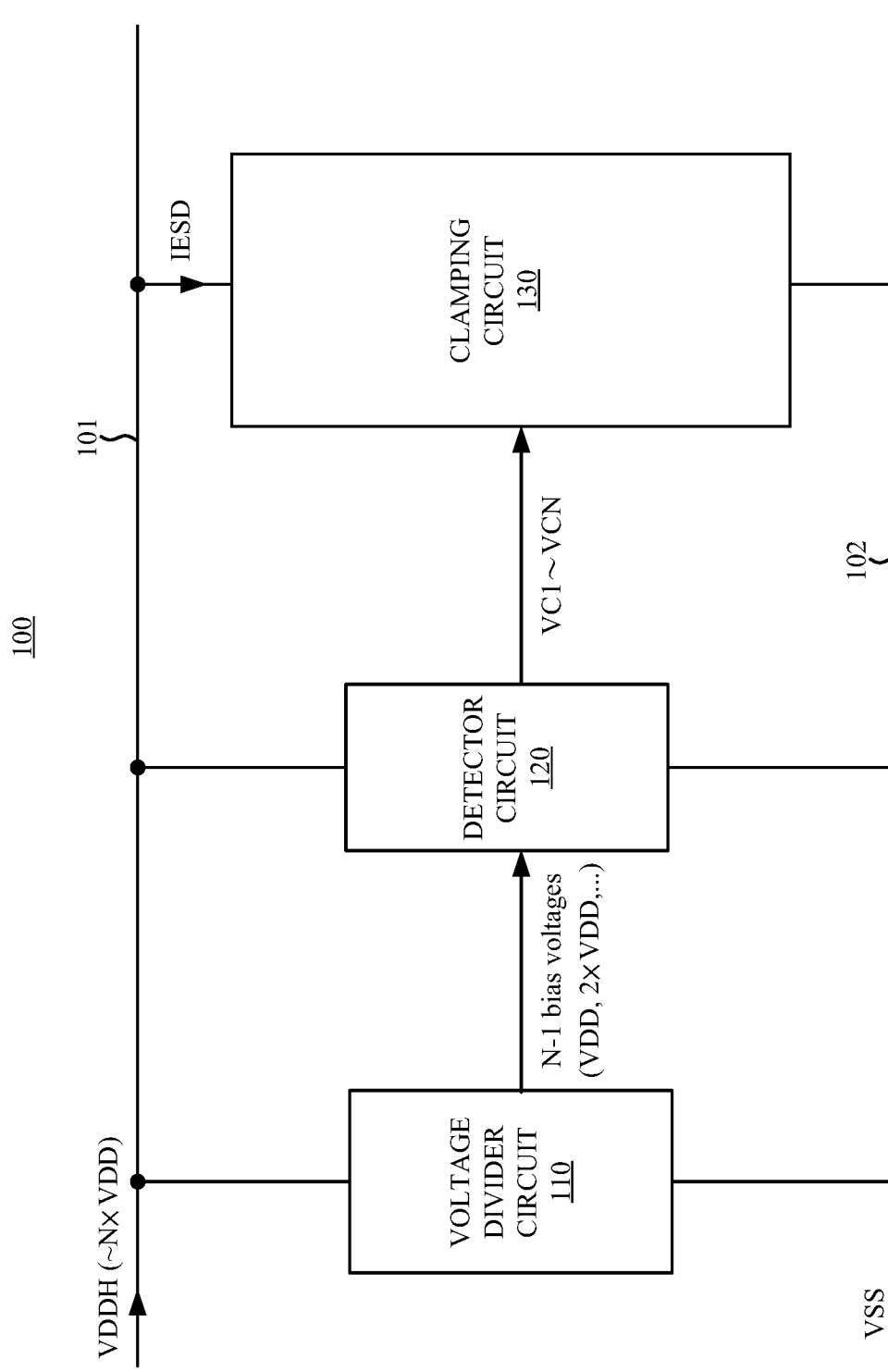
FIG. 1 is a schematic diagram of an electrostatic discharge (ESD) protection device, according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In this document, the term "coupled" may also be termed as "electrically coupled", and the term "connected" may be termed as "electrically connected". "Coupled" and "connected" may also be used to indicate that two or more elements cooperate or interact with each other.

Reference is now made to FIG. 1. FIG. 1 is a schematic diagram of an electrostatic discharge (ESD) protection device 100, according to some embodiments of the present disclosure.

In some embodiments, the ESD protection device 100 includes a voltage divider circuit 110, a detector circuit 120, and a clamping circuit 130. The voltage divider circuit 110 is coupled between power rails 101 and 102. The power rails 101 and 102 provide different voltages voltage VDDH and VSS. In some embodiments, the voltage VDDH is higher than the voltage VSS, and is N times of the voltage VDD. In some embodiments, N is a positive integer greater than or equal to 2. The voltage divider circuit 110 outputs N−1 bias voltages (e.g., voltages VDD and 2×VDD as discussed below) according to the voltages VDDH and VSS. In some embodiments, the voltage VDD is a $(N-1)_{th}$ of the N−1 bias voltages and is a lowest voltage of the N−1 bias voltages.

The detector circuit 120 is coupled to the voltage divider circuit 110 and the power rails 101 and 102, in order to receive the N−1 bias voltages and the voltages VDDH and VSS. The detector circuit 120 generates at least N control signals VC1-VCN according to the N−1 bias voltages and the voltages VDDH and VSS. Moreover, the detector circuit 120 further detects an ESD event according to a voltage level of a predetermined node (e.g., a node N1 as disused below) associated with the voltages VDDH and VSS. If the ESD event occurs, voltage levels of the at least N control signals VC1-VCN are about equal to the voltage VDDH (i.e., N×VDD). In other words, the voltage levels of the at least N control signals VC1-VCN are employed to indicate whether the ESD event occurs.

The clamping circuit 130 is coupled between the power rails 101 and 102, and is configured to be turned on according to the at least N control signals VC1-VCN, in order to provide a discharging path for a current IESD associated with the ESD event.

Figure 2:
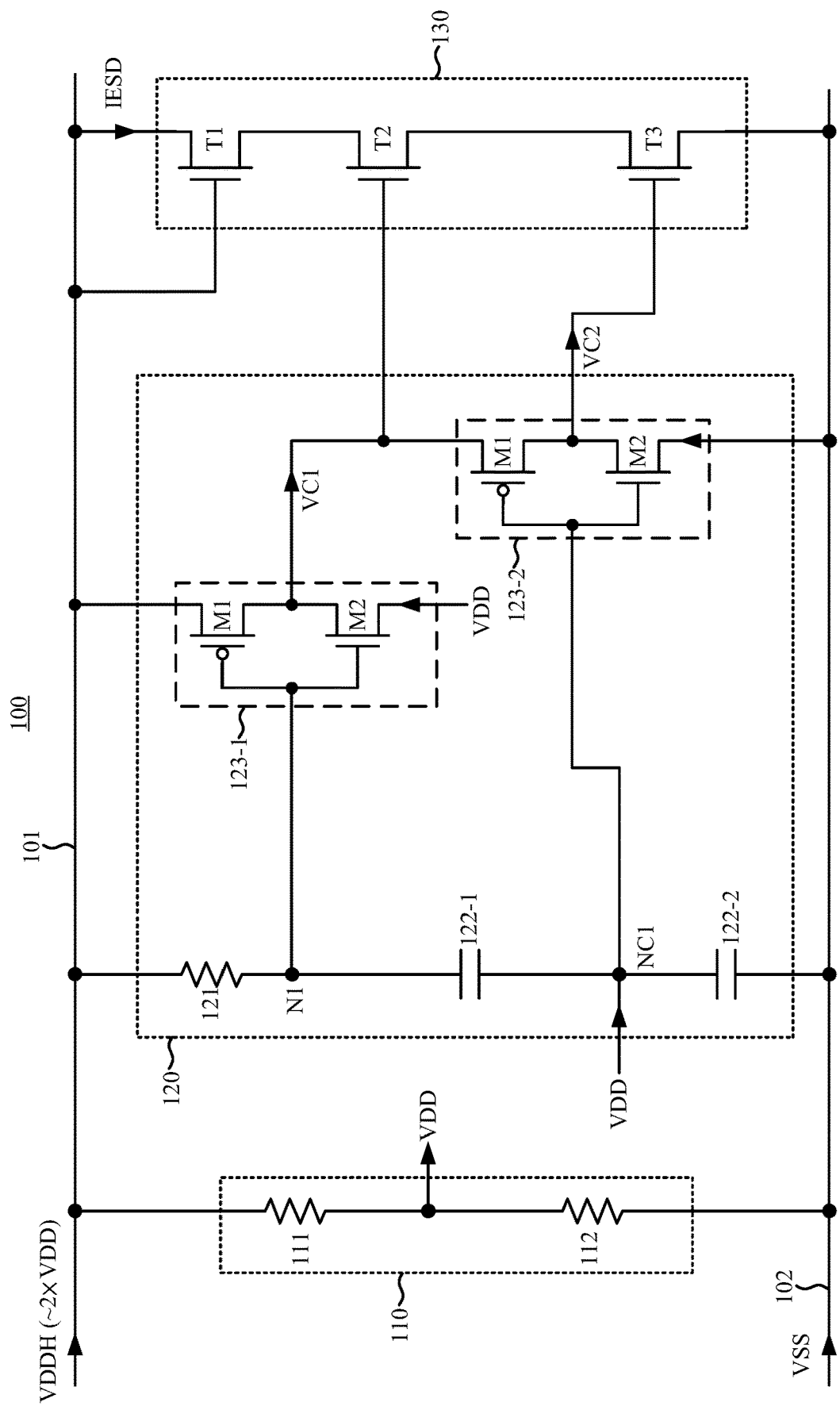
FIG. 2 is a circuit diagram of the ESD protection device in FIG. 1, according to some embodiments of the present disclosure.

The following descriptions are given with reference to examples where N=2 for illustrative purposes. FIG. 2 is a circuit diagram of the ESD protection device 100 in FIG. 1, according to some embodiments of the present disclosure. For ease of understanding, like elements in FIG. 1 are designated with the same reference numbers with respect to FIG. 2.

In some embodiments, the voltage divider circuit 110 includes at least N resistive components that are coupled in series and are configured to divide the voltages VDDH and VSS, in order to generate the N−1 bias voltages. As shown in FIG. 2, in the examples where N=2, the voltage divider circuit 110 includes resistive components 111 and 112. The resistive components 111 and 112 are coupled in series, in order to divide the voltage VDDH (e.g., 2×VDD) and the voltage VSS to generate one bias voltage VDD.

In some embodiments, the detector circuit 120 includes a resistive component 121, N coupling components 121-1~121-N and N inverters 123-1~123-N. A first terminal of the resistive component 121 receives the voltage VDDH, and a second terminal of the resistive component 121 is coupled to the predetermined node N1.

The N coupling components 122-1~122-N are coupled in series. A first terminal of the series-coupled N coupling components 122-1~122-N and the, second terminal of the resistive component 121 are coupled at the predetermined node N1, and a second terminal of the series-coupled N coupling components 122-1~122-N is configured to receive the voltage VSS. In addition, N−1 nodes are formed among the N coupling components 122-1~122-N, and are coupled to the voltage divider circuit 110 to receive the N−1 bias voltages respectively. In greater detail, as shown in examples where N=2 in FIG. 2, the coupling components 122-1 and 122-2 are coupled in series to form a node NC1 therebetween. The node NC1 is coupled to the voltage divider circuit 110 to receive the bias voltage VDD.

The coupling components 122-1~122-N may be implemented with capacitive components, in order to provide paths for coupling alter-current (AC) signals. The capacitive components may be implemented with various types of capacitor structures and/or transistor structures. The resistive components 111, 112, and 121 may be implemented with various active/passive components, which include, for example, passive resistors, resistors on-chip, or transistors. The implementations of the above components are given for illustrative purposes. Various suitable implementations of the above components are within the contemplated scope of the present disclosure.

The N inverters 123-1~123-N are coupled in cascade. A first inverter 123-1 is coupled to the power rail 101 and the voltage divider circuit 110 in FIG. 1, in order to receive the voltage VDDH (i.e., N×VDD) and a $1_{st}$ bias voltage (i.e., (N−1)×VDD). The first inverter 123-1 operates between the voltage VDDH and the $1_{st}$ bias voltage and generates a first control signal VC1 according the voltage level of the predetermined node N1.

An $N_{th}$ inverter 123-N is coupled to an output of a previous (i.e., a $(N-1)_{th}$) inverter and the power rail 102, in order to receive an $(N-1)_{th}$ control signal VCN-1 and the voltage VSS. The $N_{th}$ inverter 123-N operates between the $(N-1)_{th}$ control signal VCN-1 and the voltage VSS, and is coupled to a node NCN-1, in order to generate an $N_{th}$ control signal according to the voltage level of the node NCN-1.

In examples where N=2 shown in FIG. 2, the first inverter 123-1 operates between the voltage VDDH and the bias voltage VDD, and outputs a first control signal VC1 according to the voltage level of the predetermined node N1. A second inverter 123-2 operates between the first control signal VC1 and the voltage VSS, and generates a second control signal VC2 according to the voltage level of the node NC1.

In some embodiments, each of the inverters 123-1~123-N may include a switch M1 implemented with a P-type transistor and a switch M2 implemented with an N-type transistor. Tanking the first inverter 123-1 as an example, a first terminal of the switch M1 is configured to receive the voltage VDDH, a second terminal of the switch M1 is coupled to a first terminal of the switch M2 to output the first control signal VC1, control terminals of the switches M1 and M2 are coupled to the predetermined node N1, and a second terminal of the switch M2 is configured to receive the bias voltage VDD. Accordingly, if the voltage level of the predetermined node N1 is a high voltage, the switch M1 is turned off, and the second switch M2 is turned on. Under this condition, the inverter 123-1 outputs the control signal VC1 which substantially equals to the bias voltage VDD. Alternatively, if the voltage level of the predetermined node N1 is a low voltage, the switch M2 is turned off, and the second switch M1 is turned on. Under this condition, the inverter 123-1 outputs the control signal VC1 which substantially equals to the voltage VDDH. With this analogy, the arrangements of the remaining inverters 123-2~123-N can be understood, and thus the repetitious descriptions are not given herein.

The clamping circuit 130 includes at least N switches (e.g., T1~TN+1 in this example) that are coupled in series. In some embodiments, the switches T1~TN+1 may be implemented with N-type transistors. A first terminal and a control terminal of the switch T1 are coupled to the power rail 101, and a second terminal of the switch T1 is coupled to a first terminal of the switch T2. A second terminal of the switch T2 is coupled to a first terminal of the switch T3, and a control terminal of the switch T2 is coupled to the output of the first inverter 123-1 to receive the first control signal VC1. In other words, the switch T2 is selectively turned on according to the control signal VC1. With this analogy, a control terminal of the switch TN is coupled to an output of the $(N-1)_{th}$ inverter 123-(N−1) to receive the $(N-1)_{th}$ control signal VCN-1. The switch TN is selectively turned on according to the control signal VCN-1. A first terminal of the switch TN+1 is coupled to a second terminal of the switch TN, a second terminal of the switch TN+1 is coupled to the power rail 102 in FIG. 1 to receive the voltage VSS, and a control terminal of the switch TN+1 is coupled to an output of the $N_{th}$ inverter 123-N to receive the $N_{th}$ control signal VCN. The switch TN+1 is selectively turned on according to the control signal VCN.

In greater detail, as shown by examples where N=2 in FIG. 2, the switch T1 is coupled to the power rail 101 in FIG. 1, and is configured as a diode-connected transistor. The switch T2 is coupled to the switch T1 and the output of the inverter 123-1, and is configured to be selectively turned on according to the control signal VC1. The switch T3 is coupled to the switch T2, the output of the inverter 123-2, and the power rail 102 in FIG. 1. The switch T3 is configured to be selectively turned on according to the control signal VC2.

The following paragraphs are given for illustrating related operations of the ESD protection device 100 in FIG. 2. In normal operation, the coupling components 122-1 and 122-2 are open-circuited and thus are unable to transmit signals. Under this condition, the voltage level of the predetermined node N1 is pulled up to the voltage VDDH (which is 2×VDD in this example) via the resistive component 121, and the voltage level of the node NC1 is kept being at the bias voltage VDD. Accordingly, the inverter 123-1 outputs the control signal VC1 having the voltage level about the same as the bias voltage VDD, and the inverter 123-2 outputs the control signal VC2 having the voltage level about the same as the voltage VSS. As a result, the switch T3 is turned off. In some embodiments, the switch T1 is normally on, and the switch T3 is turned on or off according to a threshold value of practical switches. No matter whether the switch T2 is turned on or off, in this example, the discharging path provided by the clamping circuit 130 is cut off by the switch T3. In other words, in normal operation (i.e., the ESD event does not occur), the clamping circuit 130 is turned off. As a result, it is able to prevent a leakage current from flowing from the power rail 101 to the power rail 102 in normal operation.

When the ESD event occurs, the coupling components 122-1 and 122-2 are short-circuited. Under this condition, the voltage levels of the predetermined node N1 and N−1 nodes NC1~NCN-1 (which is the node NC1 in this example) are pulled down to the voltage VSS. Accordingly, the inverter 123-1 outputs the control signal VC1 having the voltage level about the same as the voltage VDDH (which is 2×VDD), and the inverter 123-2 outputs the control signal VC2 having the voltage level about the same as the voltage VDDH. As a result, the switches T2-T3 are turned on. In other words, when the ESD event occurs, the voltage levels of all control signals VC1-VC2 are about the same as the voltage VDDH to turn on the clamping circuit 130. Thus, when the ESD occurs, the clamping circuit 130 is able to provide the discharging path for the current IESD. The current IESD may be by-passed from the power rail 101 to the power rail 102 via the clamping circuit 130. As a result, a transient voltage introduced from the ESD event can be reduced, in order increase a reliability of internal components in the device.

In various embodiments, the voltage VDD is not higher than a nominal voltage (also known as a rated voltage) that can be withstood by a transistor. In various operations discussed above, a voltage drop between any two terminals of the each component is the voltage VDD. In other words, with the above arrangements, the voltage drop between any two terminals of the each component is not higher than the nominal voltage, in order to prevent the transistor from being damaged by overvoltage.

In some embodiments, the number of the at least N control signals may be larger than N. For example, the number may be K, and K is greater than N. In some embodiments, one of the K control signals may be directly generated according to the voltage VDDH. In some embodiments, one of the N−1 bias voltages may be employed to generate a plurality of control signals, in order to control the clamping circuit 130. For example, the detector circuit 120 may include K inverters, in which two of the K inverters may receive one the N−1 bias voltage and outputs of the two inverters are for different switches of the clamping circuit 130 (in this example, the clamping circuit 130 may include K series-coupled switches), but the present disclosure is not limited thereto.

Figure 3:
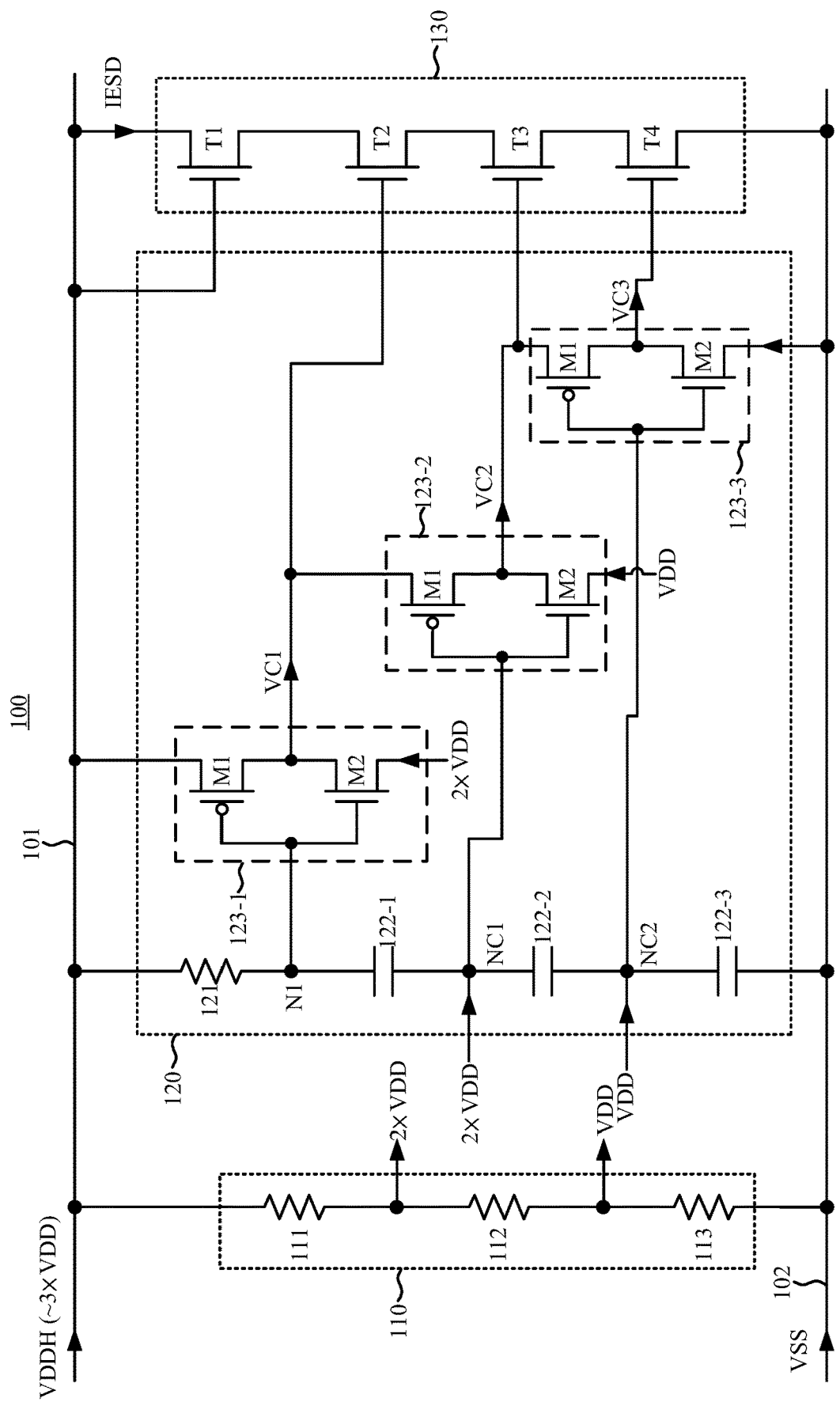
FIG. 3 is a circuit diagram of the ESD protection device in FIG. 1, according to some embodiments of the present disclosure.

The above descriptions are given for illustrative purposes with reference to examples where N=2, but the present disclosure is not limited thereto. According practical applications, the ESD protection device 100 may be employed to operate at N times of the voltage VDDH. Reference is now made to FIG. 3. FIG. 3 is a circuit diagram of the ESD protection device 100 in FIG. 1, according to some embodiments of the present disclosure. For ease of understanding, like elements in FIG. 3 are designated with the same reference numbers with respect to FIGS. 1-2.

In the examples shown in FIG. 3, N is set as 3. Compared with FIG. 2, the voltage divider circuit 110 further includes a resistive component 113, in order to divide the voltage VDDH (which is triple voltage VDD in this example) and the voltage VSS to generate a first bias voltage 2×VDD and a second bias voltage VDD. Compared with FIG. 2, the detector circuit 120 includes three coupling components 122-1~122-3 and three inverters 123-1~123-N. The three coupling components 122-1~122-3 are coupled in series to form two nodes NC1 and NC2. The nodes NC1 and NC2 are coupled to the voltage divider circuit 110 to receive the first bias voltage 2×VDD and the second bias voltage VDD.

In some embodiments, an $n_{th}$ inverter 123-n is coupled to an output of a $(n-1)_{th}$ inverter and the voltage divider circuit 110, in order to receive an $(n-1)_{th}$ control signal VCn-1 and an $n_{th}$ bias voltage, in which n is a positive integer greater than or equal to 2 and less than N. The $n_{th}$ inverter 123-n operates between the $(n-1)_{th}$ control signal VCn-1 and the $n_{th}$ bias voltage, and is coupled to a $(n-1)_{th}$ node NCn-1 of the N nodes to generate an $n_{th}$ control signal VCn according to the voltage level of the node NCn-1.

In FIGS. 3, N=3, and n=2. The inverter 123-2 operates between the control signal VC1 and the second bias voltage VDD, and generates the control signal VC2 according to the node NC1.

Compared with FIG. 2, the clamping circuit 130 further includes a switch T4. The switch T4 is configured to be selectively turned on according to the control signal VC3 outputted from the third inverter 123-3. When the ESD event occurs, the voltage levels of all control signals VC1-VC3 are about the same as the voltage VDDH (which is 3×VDD in this example). Under this condition, the switches T2-T4 are turned on to provide the discharging path.

With this analogy, the ESD protection device 100 may employ different stages of circuits according to practical applications, in order to prevent internal transistors from being damaged by over-voltage.

Figure 4:
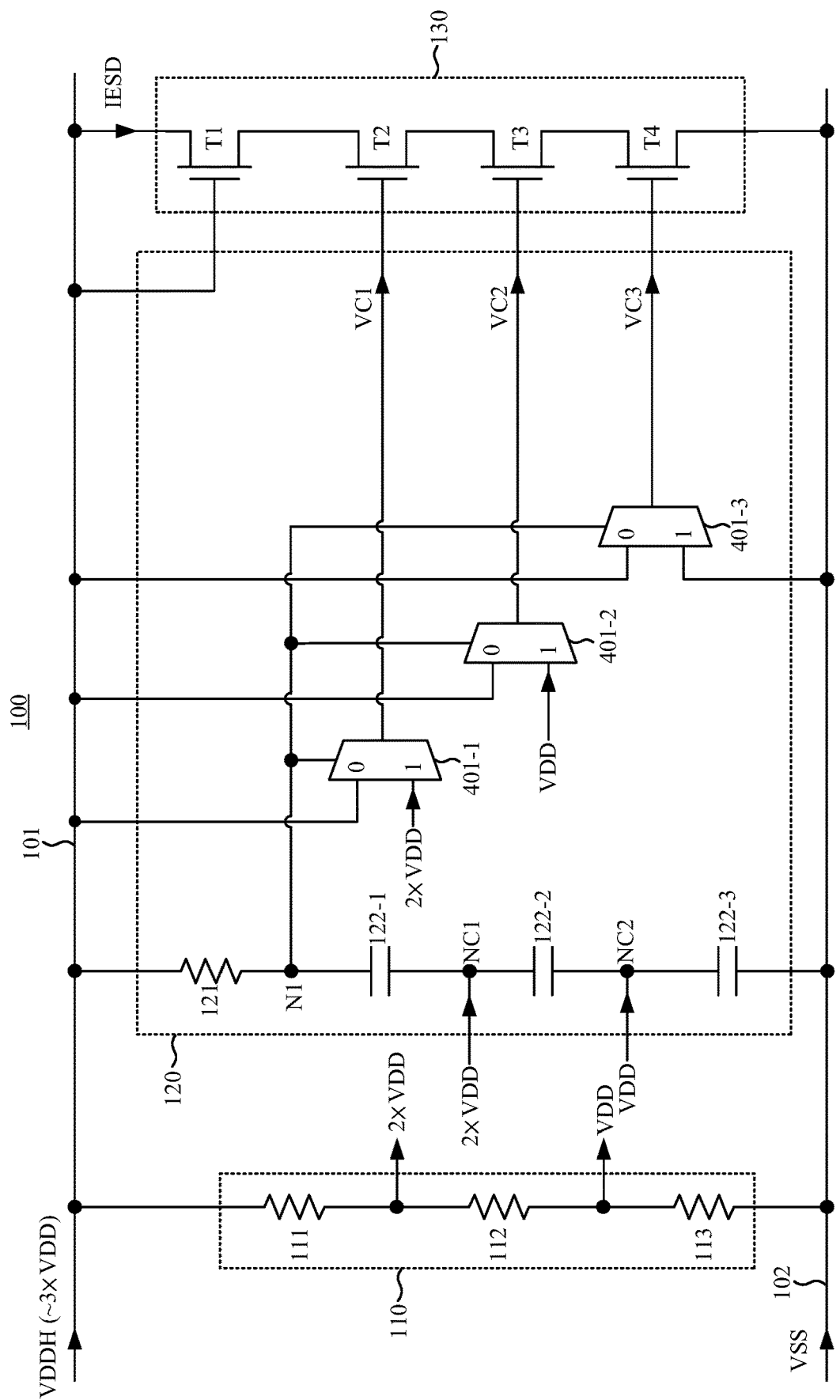
FIG. 4 is a circuit diagram of the ESD protection device in FIG. 1, according to some embodiments of the present disclosure.

Reference is now made to FIG. 4. FIG. 4 is a circuit diagram of the ESD protection device 100 in FIG. 1, according to some embodiments of the present disclosure. In this example, the detector circuit 120 includes N multiplexers 401-1~401-N. The N multiplexers 401-1~401-N output, according to the voltage level of the predetermined node N1, the voltage VDDH or output the voltage VSS and the N−1 bias voltages generated by the voltage divider circuit 110 respectively, as the N control signals VC1-VCN.

In greater detail, in examples of FIG. 4, N=3. Inputs of the first multiplexer 401-1 receive the voltage VDDH (i.e., 3×VDD) and the first bias voltage 2×VDD, inputs of the second multiplexer 401-2 receive the voltage VDDH and the second bias voltage VDD (i.e., the $n_{th}$ bias voltage), and inputs of the third multiplexer 401-3 receive the voltage VDDH and the voltage VSS. When the ESD event occurs, the voltage level of the predetermined node N1 is about the same as the voltage VSS. Under this condition, all of the multiplexers 401-1~401-3 output the voltage VDDH as the control signals VC1-VC3, in order to turn on the clamping circuit 130. In normal operation, the voltage level of the predetermined node N1 is about the same as the voltage VDDH. Under this condition, the multiplexer 401-1 outputs the bias voltage 2× VDD as the control signal VC1, the multiplexer 401-2 outputs the bias voltage VDD as the control signal VC2, and the multiplexer 401-3 outputs the bias voltage VSS as the control signal VC3. Accordingly, the switch T4 is turned off according to the control signal VC3, in order to turn off the clamping circuit 130.

The above embodiments are given for illustrative purposes with reference to examples of using inverters and/or multiplexers to implement the detector circuit 120. Various circuits to implement the same function are within the contemplated scope of the present disclosure.

As described above, the ESD protection device and the detector circuit thereof can be adjusted according to practical requirements, and can prevent a voltage drop between any two terminals of a component from being too high under various operations, in order to increase the reliability of internal components.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrostatic discharge protection device, comprising: a voltage divider circuit configured to output N−1 bias voltages according to a first voltage and a second voltage that are different from each other, wherein N is a positive integer greater than or equal to 2; a detector circuit configured to detect an electrostatic discharge event according to a voltage level of a predetermined node associated with the first voltage and the second voltage, and to generate N control signals according to the first voltage, the second voltage, and the N−1 bias voltages, wherein when the electrostatic discharge event occurs, voltage levels of the N control signals are the same as the first voltage, wherein the detector circuit comprises: a resistive component configured to receive the first voltage; and N coupling components configured to receive the second voltage, wherein the N coupling components are coupled in series, and the N coupling components in series are coupled to the resistive component at the predetermined node, wherein two adjacent coupling components of the N coupling components are directly connected to each other at one of N−1 nodes, and the one node at which the two adjacent coupling components are directly connected to each other is configured to receive one of the N−1 bias voltages; and a clamping circuit configured to be turned on according to the N control signals when the electrostatic discharge event occurs, in order to provide a discharging path for a current associated with the electrostatic discharge event, wherein the detector circuit further comprises: N multiplexers configured to output the first voltage, or to output N−1 bias voltages and the second voltage respectively, as the N control signals according to the voltage level of the predetermined node.

2. The electrostatic discharge protection device of claim 1, wherein the N−1 nodes between the N coupling components are configured to receive the N−1 bias voltages respectively.

3. The electrostatic discharge protection device of claim 2, wherein when the electrostatic discharge event occurs, the voltage level of the predetermined node and voltage levels of the N−1 nodes are pulled down to the second voltage via the N coupling components.

4. The electrostatic discharge protection device of claim 2, wherein if the electrostatic discharge event does not occur, the voltage level of the predetermined node is pulled up to the first voltage via the resistive component.

5. The electrostatic discharge protection device of claim 2, wherein the detector circuit further comprises:
N inverters configured to output the N control signals respectively,
wherein an $N_{th}$ inverter of the N inverters operates between a $(N-1)_{th}$ control signal of the N control signals and the second voltage, and is configured to generate an $N_{th}$ control signal of the N control signals according to the voltage level of a $(N-1)_{th}$ node of the N−1 nodes.

6. The electrostatic discharge protection device of claim 5, wherein a first inverter of the N inverters operates between the first voltage and a highest one of the N−1 bias voltages, and is configured to generate a first control signal of the N control signals according to the voltage level of the predetermined node.

7. The electrostatic discharge protection device of claim 5, wherein an $n_{th}$ inverter of the N inverters operates between a $(n-1)_{th}$ control signal of the N control signals and an $n_{th}$ bias voltage of the N−1 bias voltages, and is configured to generate an $n_{th}$ control signal of the N control signals according to a voltage level of a $(n-1)_{th}$ node of the N−1 nodes, wherein n is a positive integer greater than or equal to 2 and less than N.

8. The electrostatic discharge protection device of claim 1, wherein the first voltage is N times of a $(N-1)_{th}$ bias voltage of the N−1 bias voltages, and the $(N-1)_{th}$ bias voltage is a lowest voltage of the N−1 bias voltages.

9. The electrostatic discharge protection device of claim 1, wherein the N multiplexers comprise:
a first multiplexer configured to output one of the first voltage and a first bias voltage of the N−1 bias voltages as a first control signal of the N control signals according to the voltage level of the predetermined node, wherein the first bias voltage is a highest voltage of the N−1 bias voltages; and
an $N_{th}$ multiplexer configured to output one of the first voltage and the second voltage as an $N_{th}$ control signal of the N control signals according to the voltage level of the predetermined node.

10. The electrostatic discharge protection device of claim 9, wherein the N multiplexers further comprise:
an $n_{th}$ multiplexer configured to output one of the first voltage and an $n_{th}$ bias voltage of the N−1 bias voltages as an $n_{th}$ control signal of the N control signals according to the voltage level of the predetermined node, wherein n is a positive integer greater than or equal to 2 and less than N.

11. The electrostatic discharge protection device of claim 9, wherein the clamping circuit comprises a plurality of switches, the plurality of switches are coupled in series and are configured to be selectively turned on according to the N control signals respectively.

12. The electrostatic discharge protection device of claim 9, wherein the voltage divider circuit comprises N resistive components, the N resistive components are coupled in series to divide the first voltage and the second voltage to generate the N−1 bias voltages.

13. An electrostatic discharge detector circuit, comprising:
a resistive component configured to receive a first voltage;
N coupling components, wherein the N coupling components and the resistive component are coupled at a predetermined node, and the N coupling components are configured to receive a second voltage different from the first voltage, wherein when an electrostatic discharge event occurs, the second voltage is transmitted to the predetermined node via the N coupling components; and
N multiplexers configured to output the first voltage, or to output N−1 bias voltages and the second voltage respectively, as N control signals, wherein the N multiplexers comprise:
a first multiplexer configured to output one of the first voltage and a first bias voltage of the N−1 bias voltages as a first control signal of the N control signals according to a voltage level of the predetermined node, wherein the first bias voltage is a highest voltage of the N−1 bias voltages; and
an $N_{th}$ multiplexer configured to output one of the first voltage and the second voltage as an $N_{th}$ control signal of the N control signals according to the voltage level of the predetermined node,
wherein N is a positive integer greater than or equal to 2, and the N control signals are configured to control a clamping circuit, in order to bypass a current associated with the electrostatic discharge event.

14. The electrostatic discharge detector circuit of claim 13, wherein the N multiplexers further comprise:
an $n_{th}$ multiplexer configured to output one of the first voltage and an $n_{th}$ bias voltage of the N−1 bias voltages as an $n_{th}$ control signal of the N control signals according to the voltage level of the predetermined node, wherein n is a positive integer greater than or equal to 2 and less than N.

* * * * *